(12) United States Patent
Sedwick

(10) Patent No.: US 8,994,221 B2
(45) Date of Patent: Mar. 31, 2015

(54) METHOD AND SYSTEM FOR LONG RANGE WIRELESS POWER TRANSFER

(75) Inventor: Raymond J. Sedwick, University Park, MD (US)

(73) Assignee: University of Maryland, College Park, MD (US)

( * ) Notice: Subject to any disclaimer, the term of this patent is extended or adjusted under 35 U.S.C. 154(b) by 901 days.

(21) Appl. No.: 13/151,020

(22) Filed: Jun. 1, 2011

(65) Prior Publication Data

US 2012/0010079 A1 Jan. 12, 2012

Related U.S. Application Data

(60) Provisional application No. 61/350,229, filed on Jun. 1, 2010.

(51) Int. Cl.
| | |
|---|---|
| H01F 27/42 | (2006.01) |
| H01F 37/00 | (2006.01) |
| H01F 38/00 | (2006.01) |
| H03B 15/00 | (2006.01) |
| H02J 17/00 | (2006.01) |

(52) U.S. Cl.
CPC .............. *H03B 15/003* (2013.01); *H02J 17/00* (2013.01)
USPC ....................................... 307/104

(58) Field of Classification Search
CPC .......... H01F 38/14; H01F 27/28; H02J 7/025; H02J 17/00; H02J 5/005
USPC ........................................ 307/104
See application file for complete search history.

(56) References Cited

U.S. PATENT DOCUMENTS

| | | | |
|---|---|---|---|
| 7,741,734 B2 | 6/2010 | Joannopoulos et al. | |
| 7,825,543 B2 | 11/2010 | Karalis et al. | |
| 2008/0278264 A1* | 11/2008 | Karalis et al. | 333/219 |
| 2010/0231163 A1* | 9/2010 | Mashinsky | 320/108 |

OTHER PUBLICATIONS

Karalis, A., et al.; preprint of "Efficient wireless non-radiative mid-range energy transfer"; Annals of Physics; vol. 323, Issue 1, Jan. 2008, pp. 34-48.

* cited by examiner

*Primary Examiner* — Carlos Amaya
(74) *Attorney, Agent, or Firm* — Rosenberg, Klein & Lee

(57) ABSTRACT

A wireless energy transfer system includes a primary and one (or more) secondary oscillators for transferring energy therebetween when resonating at the same frequency. The long range (up to and beyond 100 m) efficient (as high as and above 50%) energy transfer is achieved due to minimizing (or eliminating) losses in the system. Superconducting materials are used for all current carrying elements, dielectrics are either avoided altogether, or those are used with a low dissipation factor, and the system is operated at reduced frequencies (below 1 MHz). The oscillators are contoured as a compact flat coil formed from a superconducting wire material. The energy wavelengths exceed the coils diameter by several orders of magnitude. The reduction in radiative losses is enhanced by adding external dielectric-less electrical capacitance to each oscillator coil to reduce the operating frequency. The dielectric strength of the capacitor is increased by applying a magnetic cross-field to the capacitor to impede the electrons motion across an air gap defined between coaxial cylindrical electrodes.

16 Claims, 7 Drawing Sheets

METHOD AND SYSTEM FOR LONG RANGE WIRELESS POWER TRANSFER

REFERENCE TO THE RELATED APPLICATION

This utility patent application is based on the Provisional Patent Application No. 61/350,229 filed 1 Jun. 2010.

FIELD OF THE INVENTION

The present invention is directed to power transfer systems, and more in particular to a system for wireless energy transfer between electromagnetic resonant objects.

More in particular, the present invention is directed to the power transfer between resonators (also referred to herein intermittently as oscillators) in highly efficient and low loss manner, thereby permitting long range wireless power transfer.

The present invention is further directed to a system for wireless power transfer with diminished resistive, dielectric, and radiative losses, where such is operated at reduced frequencies to produce higher efficiencies at long range distances.

The present invention also is directed to a system for wireless power transfer between electromagnetic oscillators spaced apart at a desired distance from each other where the system components are manufactured from superconductive materials for diminishing resistive losses. Use of dielectric materials is minimized or avoided to decrease the dielectric losses, and the operating resonant frequency is maintained below a predetermined level to attain a desired amount of power transfer at an increased efficiency level.

In addition, the present invention is directed to a system for wireless power transfer, where the oscillators are formed as superconductive dielectric-less compact (flat) coils coupled to dielectric-less (and preferably superconductive) capacitors contoured in a shape permitting the application of a magnetic field for increasing the effective dielectric strength of air or other medium between the capacitor electrodes thereby permitting a dielectric-less capacitive element with satisfactory dielectric properties.

BACKGROUND OF THE INVENTION

Wireless energy (or power) transfer is a promising approach for environmentally friendly, convenient and reliable powering of electrical and electronic devices, such as computers, electric vehicles, cell phones, etc.

Resonant Inductive Coupling pioneered by Nikola Tesla in the early 20th century has later found applications in power transfer systems.

Recent developments in the field of power transfer have demonstrated the ability to transfer 60 W power with 40% efficiency covering 2 m distance. This medium-range wireless energy transfer system (called "WiTricity") has been developed by a group of MIT scientists based on strong coupling between electromagnetic resonant objects, i.e., transmitters and receivers that contain magnetic loop antennas critically attuned to the same frequency. As presented in A. Karalis, et al., "Efficient Wireless Non-Radiative Mid-Range Energy Transfer", Ann. Phys., 10.1016 (2007), and U.S. Pat. Nos. 7,741,734 and 7,825,543, the system for wireless energy transfer includes a first resonator structure configured to transfer energy non-radiatively to a second resonator structure over medium range distances. These distances are characterized as being large in comparison to transmit-receive antennas, but small in comparison to the wavelength of the transmitted power.

The resonators in these energy transfer systems are formed as self-resonant conducting coils from a conductive wire which is wound into a helical coil of a predetermined radius r and height h surrounded by air, as shown in FIG. 1. The non-radiative energy transfer in this system is mediated by a coupling of a resonant field evanescent tail of the first resonator structure and a resonant field evanescent tail of the second resonator structure.

The ability to effectively transfer power over desired distances, depends on losses in the resonance system which may be attributed to ohmic (material absorption) loss inside the wire, radiative loss in the free space, as well as dielectric losses in dielectric materials used in the system.

In "WiTricity," the maximum power coupling efficiency of coils fabricated from standard conductors occurs at the 10 MHz range, where the combination of resistive and radiative losses are at a minimum. The effective range of these systems, i.e., a few meters at non-negligible efficiencies, has significant application within everyday life to provide power to personal electronics (laptops, cell phones) or other equipment within the confines of room. However, this type of system is incapable of efficient power transfer with respect to relatively long range applications.

It would be highly desirable to extend the reach of the resonant inductive power transfer for applications in space, for example, for the on-orbit power transfer between the elements of a satellite cluster or on the surface of the moon between a centralized power station and a rover. In order to attain greater distances in wireless power transfer, higher efficiencies of power transfer are necessary. Therefore, it is highly desirable to provide a long range power transfer system where the loss paths existing in the mid-range system are minimized or eliminated.

SUMMARY OF THE INVENTION

It is therefore an object of the present invention to provide a long range wireless power transfer system where high efficiencies of power transfer are attained due to a reduction in or elimination of parasitic loss mechanisms attributed to the internal material dissipation (resistive, or ohmic, losses) as well as radiative losses.

It is a further object of the present invention to provide a long range inductive power transfer system in which the oscillators are manufactured, based on superconducting principles (superconducting materials, as well as compactness for cryo-cooling) to reduce the ohmic losses.

It is another object of the present invention to provide an efficient long range wireless power transfer system in which the system components are free of dielectric losses.

It is also an object of the present invention to provide a long range inductive wireless power transfer system in which external capacitances are coupled to the superconductive oscillators to lower the operating frequency, thereby attaining higher efficiencies and thus permitting power transfer over greater distances. Preferably, the capacitors are manufactured from superconducting materials and are dielectric-less.

It is still a further object of the present invention to provide a power transfer system using superconducting dielectric-less system components while operating the system at a reduced operating frequency to attain effective power transfer over extended distances.

In one aspect, the present invention is envisioned as a system for long range wireless power transfer which comprises a primary oscillator and one (or a plurality of) secondary oscillator(s) displaced from the primary oscillator at a distance D (which may fall in any desired power transfer range, including both mid-range, as well as long-range over 100 m, for instance) to receive energy from the primary oscillator. The oscillators are configured into flat compact coils formed from a superconducting material and resonating substantially at the same frequency. The frequency is maintained below a predetermined frequency level (below 1 MHz, and preferably, at or below ~200 KHz) which provides a significant reduction in radiative losses in both the primary and secondary oscillators. It is important that the system is operated at wavelengths that exceed the diameter of the coils by several orders of magnitude.

The system includes a source of energy coupled up-stream of said primary oscillator and one or a plurality of power consuming unit(s) each coupled down-stream of the respective secondary oscillator.

A uni-turn drive coil is coupled between the source of energy and the primary coil. A drain coil is coupled between the secondary oscillator and the respective power consuming unit.

A plurality of capacitors may be employed in the instant system. Each capacitor is coupled to a respective oscillator. The capacitor includes a pair (or more) of coaxially disposed cylindrical electrodes including an inner cylindrical electrode and one (or more) outer cylindrical electrode(s) disposed in a co-axial surrounding relationship with the inner cylindrical electrode. An air gap is defined between cylindrical walls of the inner and outer cylindrical electrodes.

Preferably, the capacitor, similar to the oscillators, is formed from a superconducting material. The superconducting material for the oscillators and the capacitors may be any superconductor, including for example, Type I superconductors, High Temperature Superconductors, such as BSCCO, or YBCO, as well as room temperature superconductors.

Although, the air gap in the capacitor, and spaces between windings in coils may be filled with a dielectric material having a low dissipation factor, it is preferred that dielectric-less components are used in the system. In order to provide dielectric-less capacitor, having a satisfactory dielectric strength, a magnetic field is applied axially to the capacitor to increase a breakdown voltage threshold in its air gap, thereby increasing the effective dielectric strength of air in the air gap of the dielectric-less capacitor.

A booster resonator coil may be positioned between the primary and the secondary oscillators to permit even larger transfer distances. The booster resonator coil resonates in phase with the primary oscillator structure to receive energy from it and is in phase with the secondary oscillator to transfer power thereto.

A thermo-control system is provided in the subject system, which controls the cryo-equipment operatively coupled to the oscillators and capacitors. The shape and dimensions of the coils and capacitors must be compatible with dimensional abilities of the cryo-equipment.

The present invention also is envisioned as a method for long range wireless energy transfer, which includes the steps of:

fabricating primary and secondary oscillator structures as compact flat coils formed from a superconducting material, displacing the secondary oscillator from the primary oscillator a desired distance which may fall in the range below as well as exceeding 100 m, generating an oscillating current of a resonant frequency in the primary oscillator so that the oscillating current creates an oscillating field, and sensing the oscillating current of the primary coil by the second oscillator, thereby causing oscillation of the secondary oscillator structure at the same resonant frequency, thus transferring energy from the primary to the secondary oscillator.

In the subject method, by maintaining the resonant frequency below a predetermined frequency level (for example, below 1 MHz, and preferably at or below ~200 KHz), a reduced radiative loss in both the primary and secondary oscillators may be attained.

The method further comprises the steps of:

coupling a capacitor element to each of the primary and secondary coils where the capacitor is preformed to include an inner cylindrical electrode and one (or more) outer cylindrical electrode(s) co-axially disposed around the inner cylindrical electrode. Specific care is taken to define an air gap between cylindrical walls of the inner and outer cylindrical electrodes.

Finally, a magnetic field is applied axially to the capacitor to increase the effective dielectric strength of air in the air gap, thereby permitting formation of a dielectric-less capacitor which, however, has a satisfactory dielectric strength. The capacitor preferably is formed from a superconducting material.

These and other objects and advantages will become apparent from the following detailed description taken in conjunction with the accompanying patent Drawings.

DETAILED DESCRIPTION OF THE PREFERRED EMBODIMENTS

Figure 2:
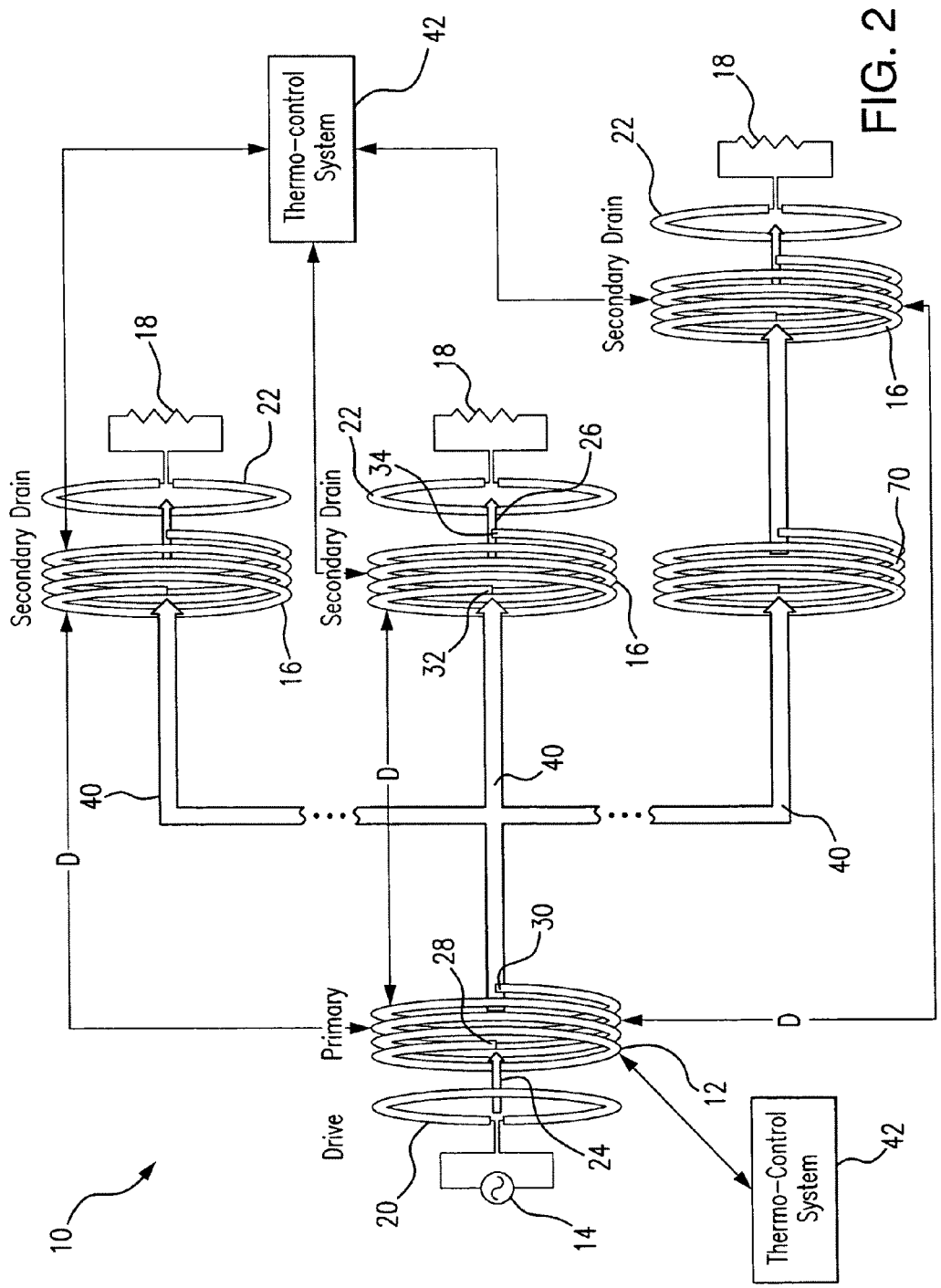
FIG. 2 is a schematic representation of a wireless energy transfer system of the present invention.
Figure 3:
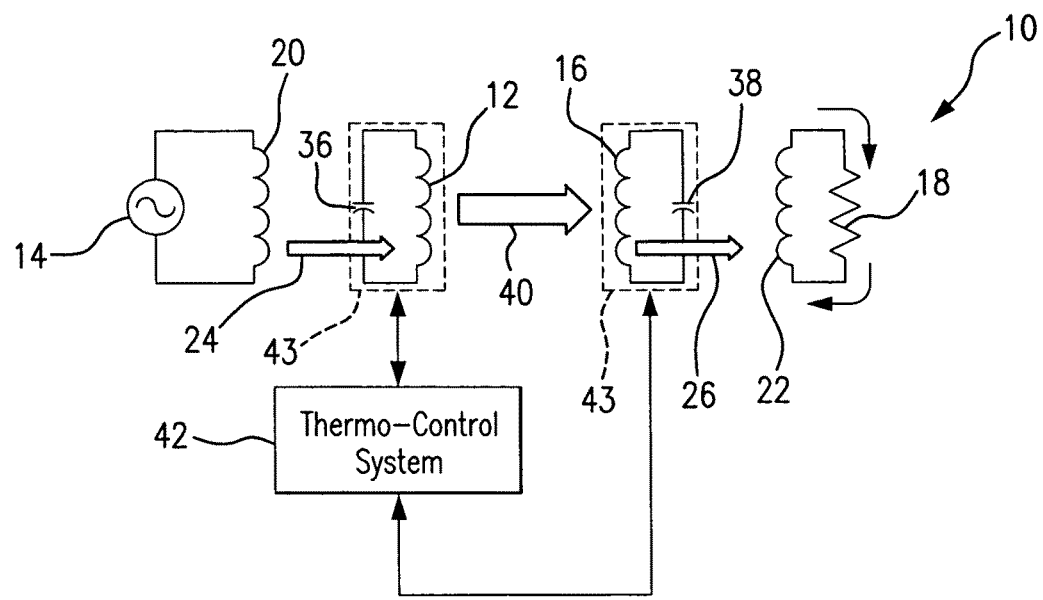
FIG. 3 is an equivalent scheme of the system presented in FIG. 2.

Referring to FIGS. 2 and 3, the system 10 for a long range inductive power transfer includes a source oscillator 12 (also referred to herein as a transmitting oscillator, or a primary oscillator) which is connected to a power source 14, and one or several receiving (also referred to herein as secondary) oscillator(s) 16 physically separated by a distance D from the source oscillator 12.

As presented in FIG. 2, the system 10 may include a number of receiving oscillators 16, each for powering a corresponding power consuming device 18, such as, for example, cell phones, TVs, computers, etc. It is to be understood by those skilled in the art, that although any number of the secondary oscillators 16 is envisioned in the present system, for the sake of simplicity further disclosure will be presented based on a single secondary oscillator design.

The energy provided by the power source 14 to the source oscillator 12 is wirelessly transferred in the system 10 in a non-radiative manner to the receiving oscillator(s) 16 over the distance D using the electromagnetic field. The distance D may fall in the range between meters to hundreds (or over) of meters, depending on the application and the ability of the power transfer system. As will be presented in further paragraphs, the present system 10 is designed with the ability to effectively transfer power over long distances, i.e., 100s of meters.

As shown in FIGS. 2-3, and 5-6, the source oscillator 12, i.e., the primary oscillator, is formed as a multi-winding coil. The receiving oscillator, i.e., the secondary oscillator 16 is similarly formed as a multi-winding coil.

Mounted close to each of the resonant coils, i.e., the primary coil 12 and the secondary coil 16 is a single turn coil. The single turn coil 20 mounted between the power source 14 and the primary coil 12 is the drive coil 20. The energy flows from the drive coil 20 to the primary coil 12 as shown by the arrow 24. The drive coil 20 is connected to the power supply 14 for being driven at the natural frequency of the primary coil 12. At this frequency, a large oscillating current is generated in the primary coil 12. This oscillating current creates an oscillating magnetic field that is then sensed by the secondary coil 16 which, as a result, will start oscillating. As the current increases in the secondary coil 16, more energy will be available for powering the respective power consuming device 18.

A single turn coil 22, referred to herein as the drain coil, couples to the secondary coil 16. The energy flows from the secondary coil 16 to the drain coil 22 as shown by the arrow 26. The load, i.e., the power consuming device 18, is connected to the drain coil 22 to receive power.

The ends of each resonant coil, i.e., primary coil 12, and secondary coil 16, may or may not be connected to capacitors. As shown in FIG. 2, the ends 28, 30 of the primary coil 12, as well as the ends 32, 34 of the secondary coil 16 are not connected.

Figure 8:
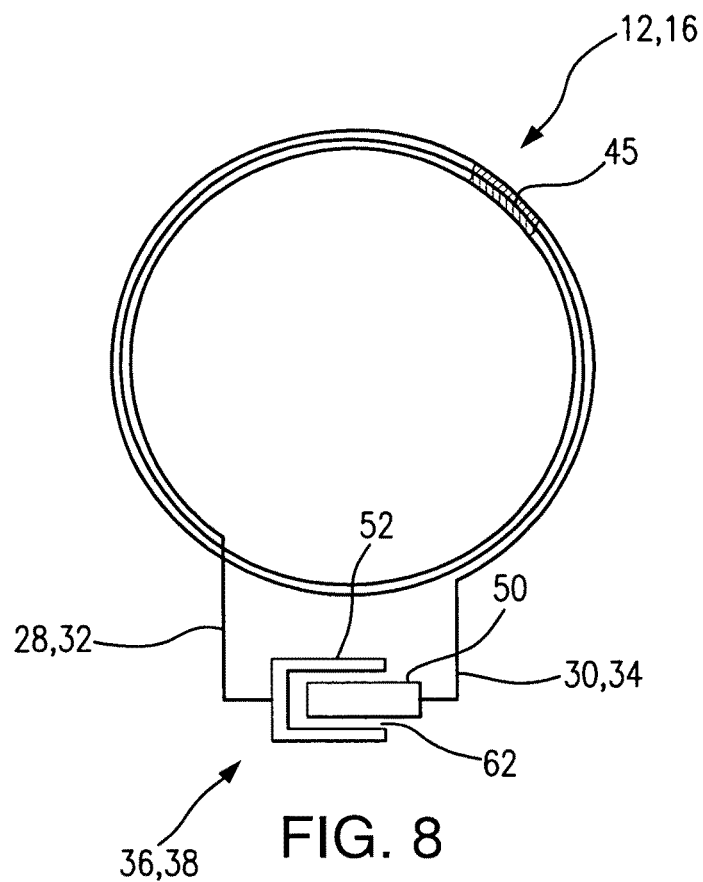
FIG. 8 is a schematic representation of the connection of the capacitor to the superconducting coil.
Figure 9:
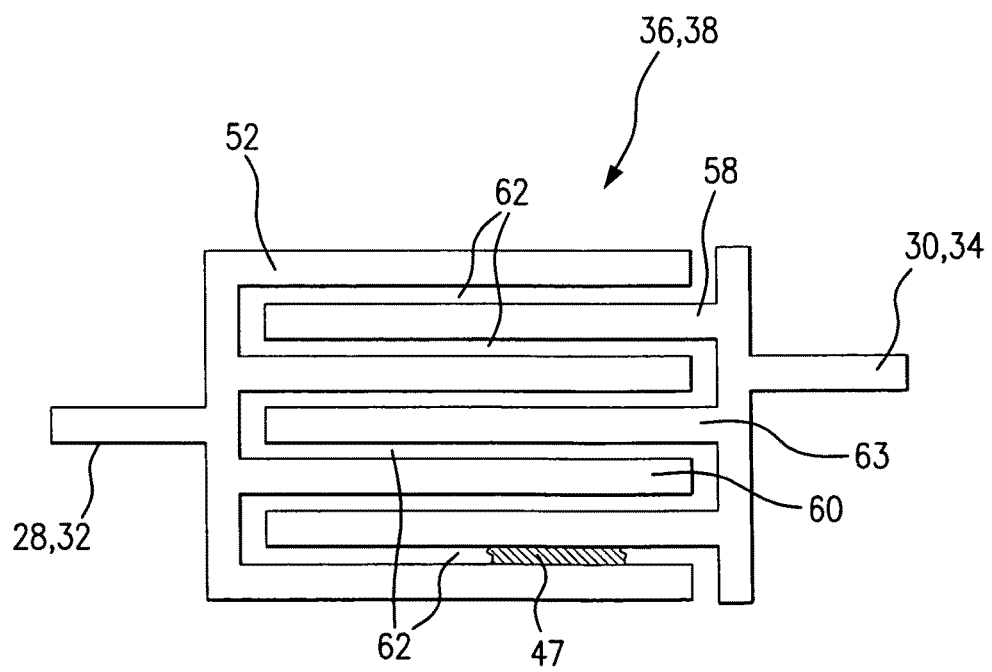
FIG. 9 shows an alternative implementation of the capacitor of the present invention.

In an alternative embodiment, in the equivalent circuit diagram shown in FIG. 3, as well as in FIGS. 8-9, the primary and secondary coil components are each shown connected to a capacitor, i.e., the capacitor 36 is coupled to the primary coil 12, and the capacitor 38 coupled to the secondary coil 16.

Even if the resonant coils 12 and 16 are not connected to the capacitors 36 and 38, respectively, they have a "self-capacitance", which in conjunction with their self inductance causes them to resonate at a particular frequency. By adding an additional external capacitance, this frequency may be lowered, so that it becomes easier to match the frequencies of the primary and secondary coils 12, 16, respectively. The operation of this system 10 is based on the ability to cause resonation of the primary and the secondary coils at the same frequency. By adding additional capacitances 36, 38 to the primary and secondary coils 12, 16, respectively, in addition to matching of the frequency of the coils 12 and 16, coils of different sizes may be used. The resonant coils, when fabricated from a superconductive material, as will be presented further herein, may be as small as 10 cm in diameter or as large as several meters in diameter. The superconductor material may be selected for example, from Type I superconductors, High Temperature Superconductors, such as BSCCO, and YBCO, as well as room temperature superconductors.

As long as the two coils, i.e., the primary coil 12 and the secondary coil 16, have the same resonant frequency, they may be, but do not have to be of the same physical size. The larger product of the two coil areas, e.g., of the primary coil 12 and the secondary coil 16, leads to the larger amount of power which can be transferred from the primary coil 12 to the secondary coil 16 as shown by the arrow 40. In some cases it may be advantageous to increase the diameter of one coil and decrease the diameter of another coil.

By lowering the losses in the primary coil 12, a higher level of the oscillating current may be created, thereby resulting in a larger magnetic field. Likewise, by lowering the losses in the secondary coil 16, a higher level of the oscillating current may be created, and more energy will be available to the load device 18.

Figure 4:
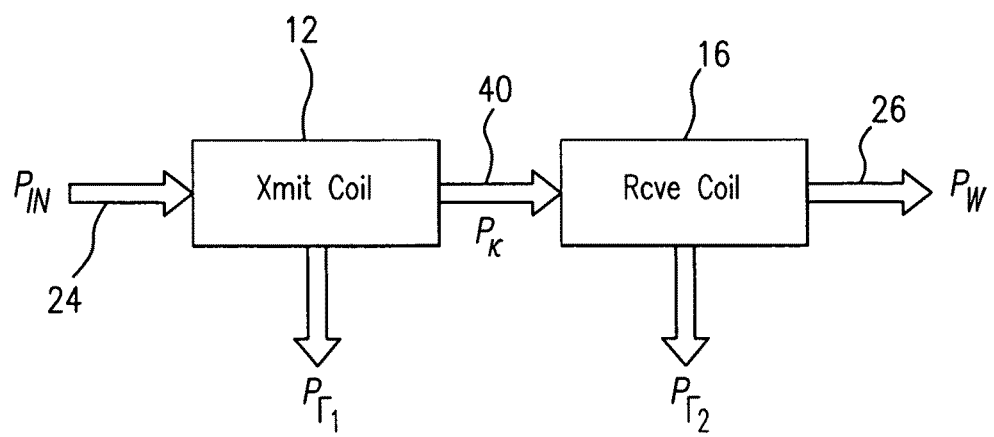
FIG. 4 is a diagram representing the power flow in the present system.

The power flow is shown schematically in FIG. 4 where the power $P_{IN}$ comes into the primary (transmitting) coil 12 from the power supply. Energy is stored in the primary coil 12 in the form of an oscillating electric and magnetic field. This energy $P_k$ may be either transmitted to the secondary (receiving) coil 16 via the channel 40, or lost as presented by $P_{r1}$.

The received power at the secondary (receiving) coil 16 also may be either transmitted (Pw) to the power consuming device, or lost as shown by $P_{r2}$.

The mechanisms for power loss are attributed either to the resistive losses in the coil wire, losses in the dielectric material that may be used in the construction of the coils and/or the capacitors, as well as to the losses due to radiated energy. It is clear that by lowering the losses in the system, a higher energy level may be available for the secondary coil 16, and a higher overall efficiency of the system 10 is attained.

In order to reduce the losses in the present system, multiple approaches have been considered and implemented, including:

A. Use of superconducting material in the construction of the components,

B. Minimizing or avoiding the use of dielectric materials in the system components, and C. Lowering the operating frequency (to below 1 MHz).

With respect to lowering the operating frequency, it is to be taken in consideration that the operating frequency cannot be lowered excessively since this approach will lower the amount of power that may be transmitted. Therefore, a balance has to be maintained between lowering the operating frequency for increasing the efficiency with which the power may be transmitted and keeping the satisfactory amount of transmitted power.

Figure 1:
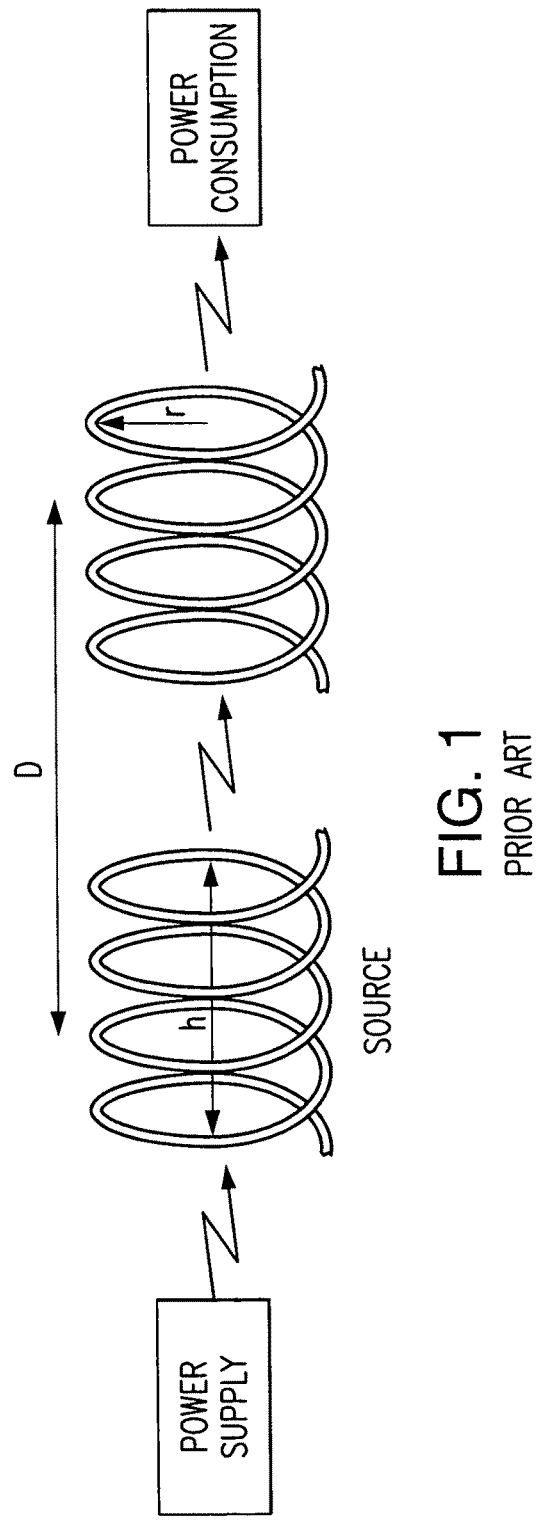
FIG. 1. is a schematic representation of a wireless energy transfer scheme of the prior art.
Figure 5:
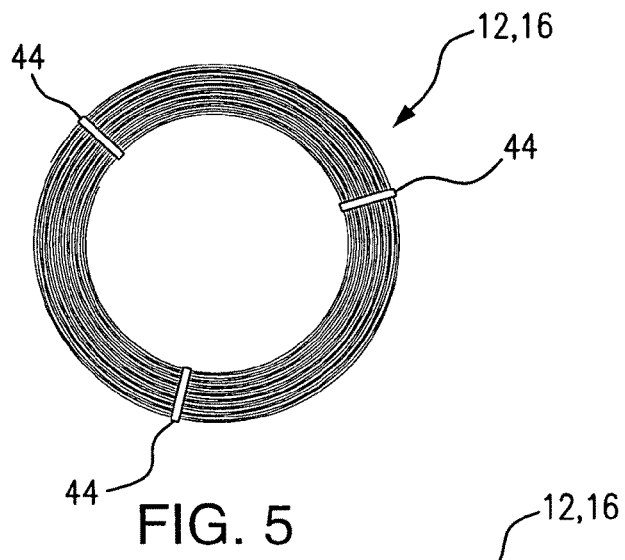
FIG. 5 is a representation of the superconducting compact oscillator of the present invention.
Figure 6:
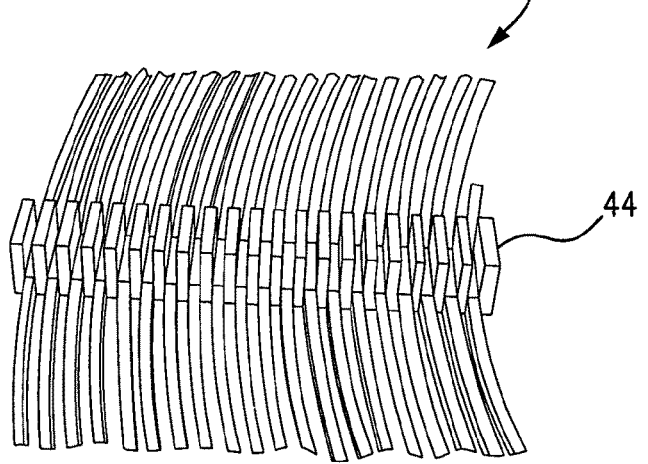
FIG. 6 is a representation of a section of the superconductive oscillator of the present invention with the "holding" mechanism.

As presented in FIGS. 5 and 6, the transmitting and receiving oscillator coils 12 and 16 are contoured as compact flat multiturn coils. As opposed to the helical geometry of the oscillators used in prior systems shown in FIG. 1 which was used to reduce the self capacitance of the coil in order to target a particular frequency (10 MHz) which was optimal with the regular conductors being used, the present system uses lower frequencies (below 1 MHz). Therefore a compact flat spiral contour is used which is advantageous in occupying a lesser volume which is important in the case of using a superconducting coil in the present system since it facilitates enclosing the coil in the cryogenic equipment 42, 43 schematically shown in FIGS. 2 and 3.

Shown in FIG. 6, the coil of the present invention is held in close-up position by a structure 44 which holds each turn of the coil spaced a predetermined fixed distance each from the other without introducing a significant amount of dielectric material between the windings. There are several structures 44 holding the coil in close-up shape as shown in FIG. 5.

Although, it is possible to manufacture the coils 12, 16 with a thin layer of dielectric 45 between the windings as shown in FIG. 8, it is preferable that there is no dielectric material used between the turns of the coils in order to diminish or eliminate dielectric losses in the coil.

The principle of the oscillator design, as well as the detailed principle of the design of the capacitors 36, 38 will be presented in following paragraphs.

Figure 7:
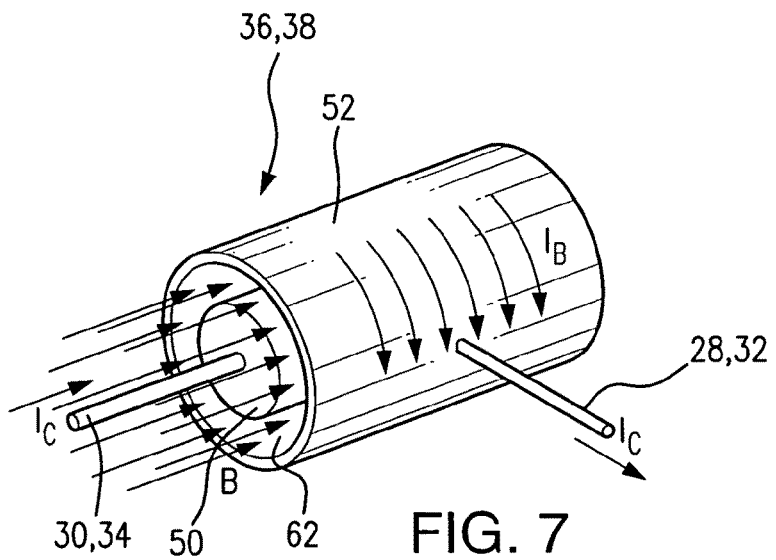
FIG. 7 is a perspective view of one configuration of the cylindrical capacitor used in the present system.

Referring to FIGS. 7-9 an air-gap capacitor 36, 38 is constructed from two coaxial cylinders 50 and 52 having different radii (a<b). Shown in FIG. 8 is the connection of the ends of the coil 12 or 16 to the cylindrical capacitor 36, 38 where one end 28, 32 of the coil 12, 16, respectively, is connected to the outer cylinder 52, while another end 30, 34 of the coil 12, 16, respectively, is connected to the inner cylinder 50. The inner and outer cylinders 50 and 52 of the capacitor 36 or 38 each corresponds to a respective electrode of the capacitor.

In order that the system 10 be functional, the capacitor 36, 38 does not have to be superconducting or even dielectric-less. However, current flowing in and out of the capacitor will suffer from ohmic (resistive) losses if it is fabricated from a regular conductor material, and likewise there will be dielectric losses present if a dielectric is used. FIG. 9 shows a section of the air gap 62 filled with a dielectric 47.

The capacitor design shown with two cylindrical electrodes is an exemplary embodiment. Any geometry may be used for the capacitor in question. The advantage of the concentric cylinders, however, is that such permits the use of a magnetic field to act as a dielectric medium.

The purpose of the dielectric in a capacitor is to allow electrodes of the capacitor to be placed closer together in order to raise the capacitance. Without the dielectric, the electrons penetrate the gap between the electrodes and cause shorting in the capacitors. However, molecules of the dielectric material respond to the changing electrical field by trying to align with it, thus resulting in their oscillation. This effect causes an internal friction that dissipates energy causing a dielectric loss. By using a magnetic field, instead of the dielectric, the electrons can be partially stopped or blocked from crossing the electrode gap, thus allowing the electrodes to be closer together without the risk of shorting. At the same time, since there is no material present, the usual dielectric losses are not seen.

The superconducting capacitor may be made of the same material as the wire of the primary and secondary coils in the system, for instance, BCCO or YBCO, or of a Type I superconductor, or a room temperature superconductor. However, as opposed to the ribbon wire of the coils, the electrodes in the capacitor are formed from solid pieces of the superconducting material.

Alternatively, as shown in FIG. 9, the capacitor also may be constructed from several concentric electrodes. In the example shown in FIG. 9, there are four concentric cylinders 52, 58, 60 and 63 in total connected alternately to the ends 28, 32, and 30, 34 of the oscillators 12, 16, respectively, thus increasing the overall capacitance. The outer cylinder 52 encircles one of the inner cylinder electrodes 58 which in turn encircles the electrode 60, etc. Any number of the concentrically disposed cylinders may be used for the capacitor design.

The theoretical and design principles of the oscillating structures as well as the capacitors in the subject system 10 will be presented further herein.

The coupled-mode theory (CMT) presented in Haus, et al., "Waves and Fields in Optoelectronics", Prentice-Hall, N.J. (1984) is a convenient framework to analyze performance of the subject system 10. For small loss levels, the formalism provides for a more physical understanding of the relevant processes.

Using a resonant circuit shown in FIG. 3, a complex amplitude corresponding to the instantaneous power is defined as $$a = \sqrt{\frac{C}{2}} v + j\sqrt{\frac{L}{2}} i \quad \text{(Eq. 1)}$$

$$W = a * a = \frac{C}{2}V_{max}^2 = \frac{L}{2}I_{max}^2$$

where C, L are the capacitance and inductance, $V_{max}$, $I_{max}$ are the peak voltage and current, v, i are the instantaneous voltage and current and W is the total energy contained within the circuit. With this definition, losses that are small with respect to the recirculated power can be introduced as $$\frac{da_1}{dt} = j\omega_0 a_1 - \Gamma_1 a_1 + j\kappa_{12} a_2 \quad \text{(Eq. 2)}$$

where $\Gamma_1 a_1$ relates to an unrecoverable drain of power to the environment and $\kappa_{12} a_2$ is an exchange of power with a second resonant device with complex amplitude $a_2$.

It may be shown by energy conservation that under this definition the coupling coefficients must be equal ($\kappa_{12}=\kappa_{21}=\kappa$) and it will be assumed throughout that the oscillators 12, 16 are identical ($\Gamma_1=\Gamma_2=\Gamma$). The figure of merit (FOM) of such a configuration is given by $\kappa/\Gamma$ which may be seen as the rate of power coupling divided by the rate of power dissipation. The regime of interest where this quantity is much greater than one is referred to as "strong coupling".

As stated earlier, in the system for power transfer, the two sources of dissipative losses are ohmic and radiative. At radio frequencies, the current travels on the outer surface of the conductor (skin effect) and the characteristic skin depth is given by $$\delta = \sqrt{\frac{2\rho}{\omega\mu}} \quad \text{(Eq. 3)}$$

where $\rho$ is the resistivity, $\omega$ is the frequency, and $\mu$ is the material permeability.

For small values of $\delta$ compared to wire radius, the resistance is therefore $$R_{ohm} = \rho\frac{l}{A} = \frac{4\pi^2 RN}{w}\sqrt{\rho f} = c_{ohm}\sqrt{f} \quad \text{(Eq. 4)}$$

where R, N and w are the coil radius, number of turns in the coil and wire width respectively, and $\bar{f}=f/(10\text{ MHz})$. The wire of the oscillating coils 12, 16, although other implementations are envisioned, as an example, is assumed to be a ribbon with a width (w) much greater than its thickness. The radiative losses are given in the quasi-static limit as—presented in [C. Balanis, et al., "Antenna Theory: Analysis and Design", Wiley, N.J., (2005)]:

$$R_{rad} \approx \frac{8\pi^3}{3}\sqrt{\frac{\mu_0}{\varepsilon_0}}\left(\frac{NA}{\lambda^2}\right)^2 = c_{rad}\bar{f}^4 \qquad (\text{Eq. 5})$$

From Eqs. 1 and 2, the rate of energy dissipation is $$\frac{dW_{loss}}{dt} = -2\Gamma W = -2\Gamma\left(\frac{L}{2}I_{max}^2\right) = -\frac{I_{max}^2}{2}R_{diss} \qquad (\text{Eq. 6})$$

where the last equality is simply an identification of the usual ohmic dissipation as a function of the RMS (Root Mean Square) current, which is $I_{max}/\sqrt{2}$.

From this it may be seen that the loss coefficient can be related to the inductance and dissipation of the coil by $$\Gamma = \frac{R_{diss}}{2L} = \frac{1}{2L}(R_{ohm} + R_{rad}) \qquad (\text{Eq. 7})$$

The coupling coefficient is defined in terms of the mutual inductance by $$\kappa = \frac{\omega M}{2L} \qquad (\text{Eq. 8})$$

where again the coils are assumed identical with inductance L.

In the quasi-static limit and at large distances D>R the magnetic flux density at the secondary coil 16 as a result of the primary coil 12 has the form of a dipole $$B = \frac{\mu_0}{4\pi}\frac{NiA}{D^3}\sqrt{1+3\sin^2\theta} \approx \frac{\mu_0}{2}\frac{NiR^2}{D^3} \qquad (\text{Eq. 9})$$

where coaxial orientation of the coils has been assumed in the last approximation. The mutual inductance is then found from the flux through the N linkages of the secondary coil 16 as $$M = N\frac{\partial \Phi}{\partial i} \approx NA\frac{\partial B}{\partial i} \approx \frac{\pi}{2}N^2\mu_0\frac{R^4}{D^3} \qquad (\text{Eq. 10})$$

The ratio of coupled to dissipated power follows $$\frac{\kappa}{\Gamma} = \frac{\omega M}{R_{diss}} = 4\pi^3\frac{N^2}{c_{rad}}\frac{R^4}{D^3}\frac{\bar{f}}{\frac{c_{ohm}}{c_{rad}}\sqrt{\bar{f}} + \bar{f}^4} \qquad (\text{Eq. 11})$$

and from the definition of $c_{rad}$, the FOM becomes $$\frac{\kappa}{\Gamma} \approx \frac{326}{D^3}\frac{\bar{f}}{\frac{c_{ohm}}{c_{rad}}\sqrt{\bar{f}} + \bar{f}^4} \qquad (\text{Eq. 12})$$

where D is in meters.

It may be seen that the FOM goes to zero at low frequencies as a result of slowly decreasing ohmic losses, as well as at high frequencies as a result of rapidly increasing radiative losses. The frequency dependence of the ohmic losses shown in Eq. 12 does not actually hold at very low frequencies where it approaches a constant value, however this does not change the result that follows. The FOM therefore has a maximum, and its value and corresponding frequency are easily found from differentiating Eq. 12

$$\left.\frac{\kappa}{\Gamma}\right|_{max} \approx \frac{216}{D^3}\left(\frac{c_{rad}}{c_{ohm}}\right)^{\frac{6}{7}}\bar{f}_{opt} = \left(\frac{1}{6}\frac{c_{ohm}}{c_{rad}}\right)^{\frac{2}{7}} \qquad (\text{Eq. 13})$$

The loss mode ratio governing the optimal frequency is related to the coil design parameters by $$\frac{c_{ohm}}{c_{rad}} \approx 52\frac{\sqrt{\rho}}{wNR^3} \qquad (\text{Eq. 14})$$

For a copper coil used in the prior art system with parameters R=30 cm, w=4 mm, N=1 is seen to have an optimal frequency of 10.6 MHz ($\bar{f}$=1.06) and a corresponding coupling ratio (FOM) equal to 117. Eqs. 13 and 14 provide a method of designing a set of coils for a particular frequency in such a way as to maximize the coupling with minimum loss.

Figure 10:
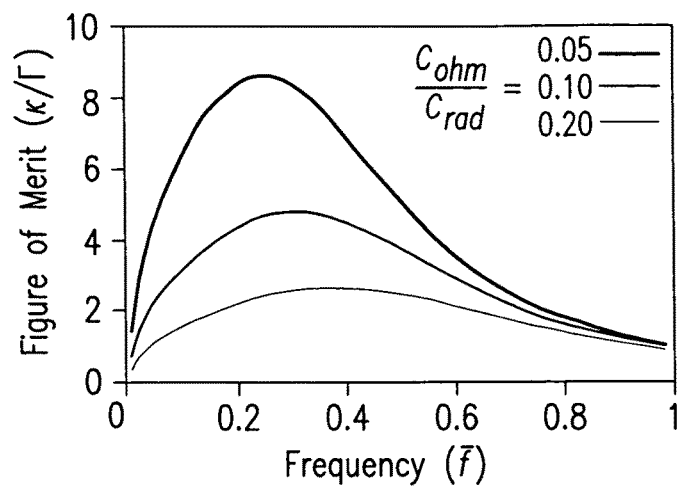
FIG. 10 is a diagram representing the variation of the Figure Of Merit (FOM) with dimensionless frequency for different loss mode ratios in the wireless energy transfer system.

An immediate consequence of the result of the analysis presented supra is that a reduction in the resistivity of the oscillator provides for an increase in the efficiency of the coupling. By eliminating the resistive losses of the primary and secondary coils 12, 16, there is freedom to drive the frequency to lower values, reducing the radiative losses as well. FIG. 10 shows the frequency dependent portion of the FOM (Eq. 12) for three different loss mode ratios. As expected, the optimal value of the frequency is tending toward lower frequencies in the limit that the resistive losses are zero.

It is instructive to adopt the definition given in [A. Kurs, et al., "Wireless Power Trans. Via Strongly Coupled Mag. Resonances", Science, 317 (2007)] for the efficiency of the power transfer, given as $$\eta = \frac{\Gamma_W|a_2|^2}{\Gamma|a_1|^2 + (\Gamma+\Gamma_W)|a_2|^2} \qquad (\text{Eq. 15})$$

where $2\Gamma|a_1|^2$ and $2\Gamma|a_2|^2$ are the rates of power dissipation in each oscillator coil as discussed in the previous paragraphs, and $2\Gamma_W|a_2|^2$ is the rate of power transferred into a load coupled to the secondary coil 16.

A similar loss may be attributed to the amplifier driving the primary coil 12, but the efficiency will be defined as relative to the output power of the amplifier. In steady-state, the power that is coupled to the secondary coil 16 must equal the total power consumed by both dissipation and the load draw. This results in a relationship between the energy content of each resonator $$\kappa^2|a_1|^2 = (\Gamma+\Gamma_W)^2|a_2|^2 \quad \text{(Eq. 16)}$$

and allows the efficiency to be expressed solely in terms of loss and coupling parameters $$\eta = \frac{\frac{\Gamma_W}{\Gamma}\left(\frac{\kappa}{\Gamma}\right)^2}{\left(1+\frac{\Gamma_W}{\Gamma}\right)^2 + \left(1+\frac{\Gamma_W}{\Gamma}\right)\left(\frac{\kappa}{\Gamma}\right)^2} \quad \text{(Eq. 17)}$$

Differentiating this expression with respect to $\Gamma_W/\Gamma$, the maximum efficiency occurs when $$\Gamma_W^2 - \Gamma^2 = \kappa^2 \quad \text{(Eq. 18)}$$

and at this condition, the efficiency may be expressed as $$\eta_{max} = \frac{\Gamma_W - \Gamma}{\Gamma_W + \Gamma} = \frac{\sqrt{1+\left(\frac{\kappa}{\Gamma}\right)^2} - 1}{\sqrt{1+\left(\frac{\kappa}{\Gamma}\right)^2} + 1} \quad \text{(Eq. 19)}$$

While efficiency is certainly a driver of the subject system design, the actual power level that can be transferred to a load 18 on the receiving end is of a great importance as well. This power is related to the recirculating energy of the coil and using Eq. 16 may be expressed as $$P_W = 2\Gamma_W|a_2|^2 \quad \text{(Eq. 20)}$$
$$= \frac{2\Gamma_W\kappa^2}{(\Gamma+\Gamma_W)^2}|a_1|^2$$
$$= 2\Gamma\left(\frac{\kappa}{\Gamma}\right)^2\left(\frac{\Gamma_W}{\Gamma}\right)\left(1+\frac{\Gamma_W}{\Gamma}\right)^{-2}\left(\frac{1}{2}LI^2\right)$$

This expression may also be differentiated with respect to $\Gamma_W/\Gamma$ to find the ratio of load to dissipation that maximizes the power. This results in $\Gamma_W/\Gamma=1$, and the maximum power to the load is therefore $$P_W = \frac{\Gamma}{4}\left(\frac{\kappa}{\Gamma}\right)^2(LI^2) \Rightarrow \eta = \frac{1}{2}\left(2\left(\frac{\kappa}{\Gamma}\right)^{-2}+1\right)^{-1} \quad \text{(Eq. 21)}$$

showing that for maximum power transfer, the dissipation should be at a minimum and the energy content and coupling should be at a maximum. Also shown is the resulting efficiency at the condition of maximum power transfer, and it may be seen that the efficiency approaches a maximum value of 50% as the FOM increases.

To estimate the power and efficiency at a nominal distance of 100 meters, Eq. 12 is used in the superconducting limit $$\frac{\kappa}{\Gamma} \approx \frac{326}{(\bar{f}D)^3} \quad \text{(Eq. 22)}$$

and at 200 kHz, $\bar{f}$=0.02, so that $\kappa/\Gamma \approx 41$ and $\eta_{max} \approx 95\%$.

To estimate the power delivered, the product of $\Gamma L$ is given by Eqs. 5 and 7 as $\Gamma L = \frac{1}{2}c_{Rad}\bar{f}^4$, again with no ohmic losses.

Assuming a coil design having 100 turns of wire and a radius of 0.5 meters, $c_{Rad}$=237. At maximum efficiency $$\frac{\Gamma_W}{\Gamma} = 0.026,$$

and if $I_{max}$=100 amps then the power delivered at 100 meters is 7.8 Watts. However, if the maximum power coupling is desired, $\Gamma_W$ is matched to $\Gamma$, and from Eq. 21 the efficiency is ~50%. The power delivered at 100 meters in this case is 80 Watts. From Eqs. 19 and 21, and from the performance numbers just discussed, it is seen that there is a conflict between maximizing efficiency and maximizing power delivered.

Figure 11:
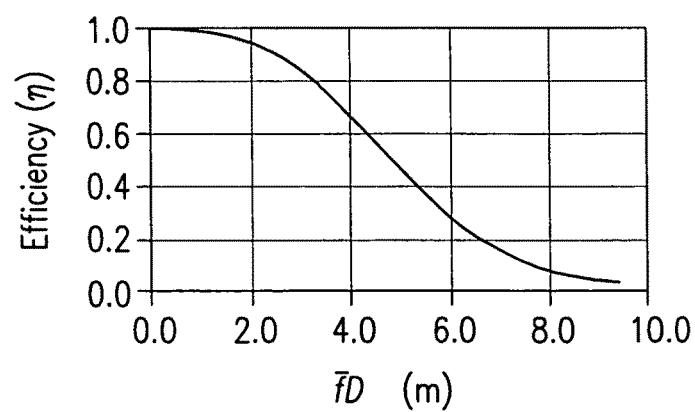
FIG. 11 is a diagram representing a maximum efficiency versus normalized frequency-distance product for the case of zero ohmic dissipation.

Consider the case when maximizing the efficiency is the goal. Eq. 19 shows that the efficiency is not appreciably affected until $\kappa/\Gamma$ drops below a value of around 3, corresponding to a frequency-distance product ($\bar{f}D$) approaching ~5. At this point the maximum efficiency drops to 50% and at 200 kHz this corresponds to a distance of 250 meters. Reducing the frequency by a factor of 10 will extend this 50% value of maximum efficiency out to 2.5 km. The relationship between maximum efficiency and $\bar{f}D$ in the limit of no ohmic dissipation is shown in FIG. 11.

The results discussed above are for optimal efficiency, where the power drawn by the load is related to the radiative losses and coupling coefficient by Eq. 18. This condition can be maintained by actively varying the load to shunt excess power into onboard storage or extract it from storage when needed. It is of interest to investigate how the efficiency changes as a result of off-nominal operations to assess how closely such a system would have to track power usage.

In the strong coupling regime, the maximum efficiency occurs when $\Gamma_W/\kappa \approx 1$, but from Eq. 17, the efficiency can be found that results over a continuum of load to coupling ratios, spanning either side of the optimal value.

Figure 12:
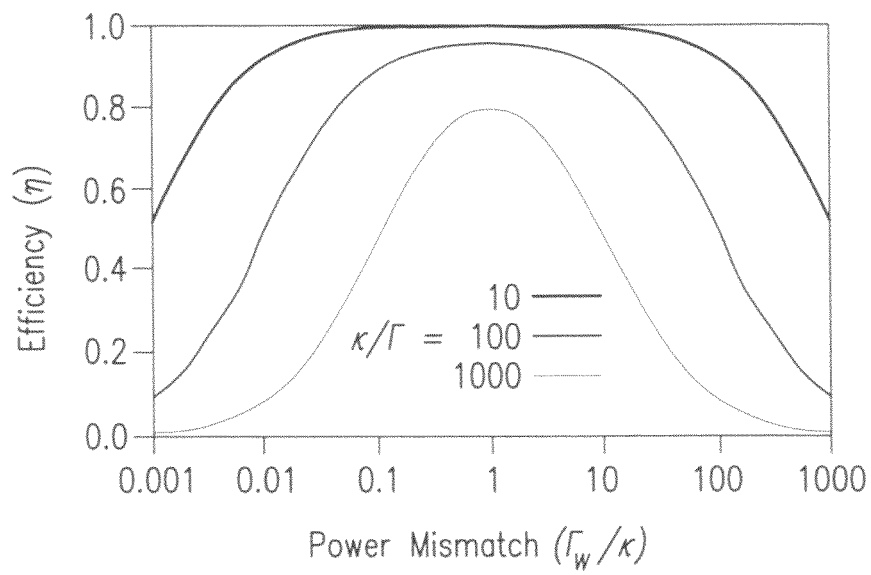
FIG. 12 is a diagram representing efficiency versus power mismatch.

In FIG. 12, the variation of efficiency with $\Gamma_W/\kappa$ for several values of $\kappa/\Gamma$ is shown. It may be seen that the sensitivity of the efficiency to a mismatch in power goes down as the coupling strength increases. In fact, the half-max value of the efficiency occurs where $\Gamma_W/\kappa = (\kappa/\Gamma)^{\pm 1}$. The FOM may therefore also be interpreted as the effective 'bandwidth' for efficient power coupling. Thus, operating in the strong coupling regime means that closely matching the load to an optimal value is not critical, and in fact a considerably large mismatch may only reduce the efficiency by an acceptably small amount.

Oscillator Design Considerations

In the previous paragraphs, a frequency of 200 kHz was selected for use with a superconducting oscillator 12, 16 to improve the efficiency over what can be achieved using non-superconducting materials. As opposed to the design of "WiTricity" where a regular conducting wire was used in order to create a coil that has a natural resonance in the 10 MHz range to provide maximum efficiency, helical coils having large torsion were used as a way of reducing their self-capacitance. Since lower frequencies (below 1 MHz, and, for example, preferably at or below 200 KHz) are of interest in the present system, more compact coils are considered for the oscillators 12, 16.

The subject oscillators 12, 16 are formed from a superconducting wire, for example, one that is commercially available and is formed in the shape of ribbon that can be conveniently wound into a flat spiral 12, 16. An example of such wire is Bismuth Strontium Calcium Copper Oxide (BSCCO). BSCCO ("bisko") is a family of High Temperature Superconductors (HTS), having a critical temperature of around 110 K. As such, they can be easily cooled using liquid nitrogen (77 K at 1 atmosphere), or by using a thermocontroller 42 for controlling a plurality of cryo-coolers 43, as schematically shown in FIGS. 2 and 3. BSCCO is a high temperature superconductor which does not contain a rare earth element, and is formed into wires and offered commercially. Also, Type I superconductor materials, as well as room temperature superconductors, may be used as a material of the spirals 12, 16. In one embodiment, a dielectric 45, such as 2 mil Kapton tape, may be present between the windings of the coils 12, 16, as shown in FIG. 8.

The inductance for such a winding is given by {E. Rosa, "The Self and Mutual Induct. Of Linear Conductors", B. of the Bureau of Standards, 4, 2 (1908)}.

$$L \approx \frac{4\mu_0 R^2 N^2}{R + 1.4h} \approx 4\mu_0 R N^2 \quad \text{(for } R > h\text{)} \quad \text{(Eq. 23)}$$

where h (hereafter assumed negligible) is the difference between the inner and outer radii of the windings and the other parameters are as previously defined.

The issue of "self-capacitance" of the oscillators 12, 16 is more complicated. The flat spiral can be thought of as a long parallel plate capacitor, wrapped around onto itself. The capacitance per unit length around the spiral is a constant, however the voltage distribution across the capacitor is not constant from one end to the other, resulting in a variation in the energy distribution. With the ends 38 of the spiral 30 unconnected, the fundamental frequency of the coil will correspond to a half wavelength standing wave across the entire coil, such that the current in the coil goes to zero at the ends. The distribution of current, charge and potential around the spiral can be given by $$I(x,t) = I_{max}\sin(\pi x/l)\cos\omega t \quad \text{(Eq. 24)}$$
$$q(x,t) = -q_{max}\cos(\pi x/l)\sin\omega t$$
$$V(x,t) = \frac{V_{max}}{2}\cos(\pi x/l)\sin\omega t$$

where the time phase of the current has been arbitrarily chosen, and the resulting functional forms of charge and potential satisfy charge conservation and Poisson's equation around the spiral. $V_{max}$ has been defined as the potential across the entire coil (end to end) and will be used to define the capacitance.

The energy per unit volume of insulator between the windings of the coil at any given location around the spiral is given by $$W = \frac{1}{2}\varepsilon_r\varepsilon_0 E^2 = \frac{1}{2}\varepsilon_r\varepsilon_0 \left[\frac{V(x) - V(x + 2\pi R)}{d}\right]^2 \quad \text{(Eq. 25)}$$

where the voltage difference is taken between any point on the spiral 12, 16 and the nearest point one turn farther along the spiral, directly across the dielectric between the windings. Multiplying by the cross-section of the dielectric (wd), and integrating over the length of the spiral (l≈2πRN), the maximum total energy stored in the electric field is given as $$\frac{1}{2}CV_{max}^2 = \frac{1}{2}\left(\frac{\varepsilon_r\varepsilon_0\pi^3 Rw}{4Nd}\right)V_{max}^2 \quad \text{(Eq. 26)}$$

where N>1 has been assumed. Combining the results of Eqs. 23 and 26, the natural frequency of the flat spiral coil is given by $$\bar{f} \approx \frac{8.6}{R}\sqrt{\frac{d}{\varepsilon_r Nw}} \quad \text{(Eq. 27)}$$

A coil radius of R=0.5 m may be assumed along with the aforementioned 200 kHz target frequency. The HTS wire mentioned above may be 4 mm wide, so using 2 mil Kapton with a dielectric constant of 4.0 in this baseline design results in a natural frequency of 96 kHz.

The required strength of the dielectric can be found by equating the energy contained in the magnetic field at peak current to the energy stored in the electric field at zero current, given by Eq. 26. The peak current ($I_{max}$) is related to the RMS current over ½ wavelength (denoted RMS/2) by a factor of ½, resulting in the relation $$\frac{1}{2}LI_{RMS/2}^2 = \frac{1}{8}LI_{max}^2 = \frac{1}{2}\left(\frac{\varepsilon_r\varepsilon_0\pi^3 Rw}{4Nd}\right)V_{max}^2 \quad \text{(Eq. 28)}$$

and consequently $$V_{max} = \left(\frac{4\mu_0 N^3 d}{\varepsilon_r\varepsilon_0\pi^3 w}\right)^{\frac{1}{2}} I_{max} \approx 135\sqrt{\frac{N^3 d}{\varepsilon_r w}} I_{max} \quad \text{(Eq. 29)}$$

From Eq. 24, the maximum potential difference across the dielectric will occur near the center of the coil length where the gradient of the potential around the coil is the largest. Multiplying the maximum gradient by the length of a single turn, the largest potential seen across the dielectric is given by $$\Delta V_{max} = \left(\frac{\mu_0 Nd}{\varepsilon_r\varepsilon_0\pi w}\right)^{\frac{1}{2}} I_{max} \approx 213\sqrt{\frac{Nd}{\varepsilon_r w}} I_{max} \quad \text{(Eq. 30)}$$

Using the baseline numbers, the maximum electric field seen across the dielectric will be 262 V/mm, which is well below the dielectric strength of Kapton (197 kV/mm).

A problem associated with this design results from dissipative losses in the dielectric. The dissipation factor, also known as the loss tangent under the relation DF=tan δ, represents the ratio of resistive power loss to reactive power in the capacitor. Under the current formalism, the dissipation factor is introduced in the same manner as the previous resistive loss term $$\Gamma_{DF} = \frac{R_{DF}}{2L} = \frac{L\omega\tan\delta}{2L} = \frac{\omega}{2}\tan\delta \quad \text{(Eq. 31)}$$

where the matching of the reactance of the coil 12, 16 and capacitor 36, 38 at resonance has been used. This result is somewhat problematic for the efficiency, since the dissipation in the dielectric scales identically to the power that can be coupled. It is therefore of utmost importance either to eliminate the dielectric whatsoever from the coils 12, 16 and the capacitors 36, 38, or to use dielectrics with the smallest possible dissipation factor.

The effect of DF (dissipation factor) can be inserted directly into Eq. 12, resulting in $$\frac{\kappa}{\Gamma} \approx \frac{326}{D^3} \frac{1}{\frac{c_{DF}}{c_{rad}} + \overline{f}^3} \quad \text{(Eq. 32)}$$

where elimination of the resistive losses in the coil has still been assumed. The ratio of the loss coefficients is then $$\frac{c_{DF}}{c_{rad}} = 830 \frac{\tan\delta}{R^2} \approx 830 \frac{\delta}{R^2} \quad \text{(Eq. 33)}$$

and the need for a low dissipation factor becomes quite evident. At low frequencies, the dissipation in the dielectric will dominate the radiative losses, just as was the case for the ohmic losses previously.

To get a feel for this limitation, consider the use of fused quartz as a dielectric, which has a relatively low dissipation factor (~$10^{-4}$). For the baseline design of R=0.5 m, the ratio in Eq. 33 is approximately equal to 0.33. The dissipation due to the dielectric would then be comparable to the radiation losses at a frequency of $\overline{f} = \sqrt[3]{0.33} \approx 0.69$ or about 7 MHz. Evidently, a comparable loss level to what existed before the superconducting wire was introduced has returned.

To return to the efficiency offered by reducing the frequency to below 1 MHz, for example to about or below ~200 kHz, the ratio of dissipative loss to radiative loss given in Eq. 33 would have to be reduced by a factor of at least $10^{-5}$. This does not appear to be a viable approach unless the dielectric is removed altogether as shown in the presented embodiment of FIGS. 5-6. Even the presence of a cryogen such as liquid nitrogen to cool the superconducting wire will result in a loss tangent of approximately 5($10^{-5}$), so designs apparently must avoid the use of any dielectric in the inter-electrode space.

Superconducting Capacitor Design

Once the ohmic and dielectric losses are removed from the coil 12, 16, the resulting natural frequency may not be at the level desired for the system operation. Further reduction in frequency may be made possible by adding more capacitance 36, 38 externally to the coil 30, as shown in FIGS. 2, 3 and 8. The use of capacitors without dielectrics is desired in order to retain the high Q-values of the superconducting oscillator 12, 16. The limitation of the dielectric-free capacitor 36, 38 is the low dielectric strength of the remnant gas in the gap. An approach taken herein with the goal to increase the breakdown voltage of the capacitor 36, 38 without introducing dielectric loss is to inhibit the avalanche ionization of the gas medium by applying a magnetic field.

As shown in FIGS. 7 and 8, an air-gap capacitor 36, 38 is constructed from two coaxial cylinders 50, 52 of radii a and b (with a<b), respectively. An axial magnetic flux density $B_z$ is applied, either by placing permanent magnets at the end of the cylinders, or by inducing an azimuthal current in the outer cylinder. In FIG. 7, $I_C$ is the circuit current between the capacitor 36, 38 and the coil 12, 16, respectively, and $I_B$ represents a steady current that could produce the desired magnetic field.

The electric field in the capacitor 36, 38 is purely radial, but its magnitude changes in time cyclically over a period $1/(10\overline{f})$ μsec. As the electric field at the surface of each cylinder 50, 52 increases, electrons will leave the surface until an avalanche occurs near the dielectric strength of the air gap. In the presence of a uniform axial magnetic field, the motion of electrons that leave the surface of either cylinder can be idealized to three primary components—cyclotron, E×B drift and polarization drift. These are given respectively as:

$$\vec{v}_c = \sqrt{2mK}\,\hat{e}_\perp \quad \text{(Eq. 35)}$$

$$\vec{v}_{EB} = \frac{E_r}{B_z}\hat{e}_\theta$$

$$\vec{v}_p = \frac{1}{\Omega}\frac{E_r}{B_z}\hat{e}_r$$

where the first notion describes perpendicular motion around the magnetic field lines, the second notion is azimuthal motion around the inner electrode cylinder, and the third notion corresponds to the radial motion across the air gap. In these expressions, K is the kinetic energy of the electron, and $\Omega$ is the electron gyro frequency.

If the cyclotron radius is small compared to the air gap 62, then the motion will be a superposition of these small gyrations with a bulk spiral motion whose direction depends on the changing electric field. By limiting the otherwise unimpeded radial motion of free electrons to that of the polarization drift velocity across the field lines, the expectation is that breakdown in the air gap 62 can be suppressed.

From Gauss' law, the radial electric field is found as a function of radial position and substituted into the polarization drift expression to yield $$v_p = \dot{r} = \frac{1}{\Omega}\frac{E_r}{B_z} = \frac{m_e q}{eB_z^2 C \ln(b/a) r} \quad \text{(Eq. 36)}$$

Figure 13:
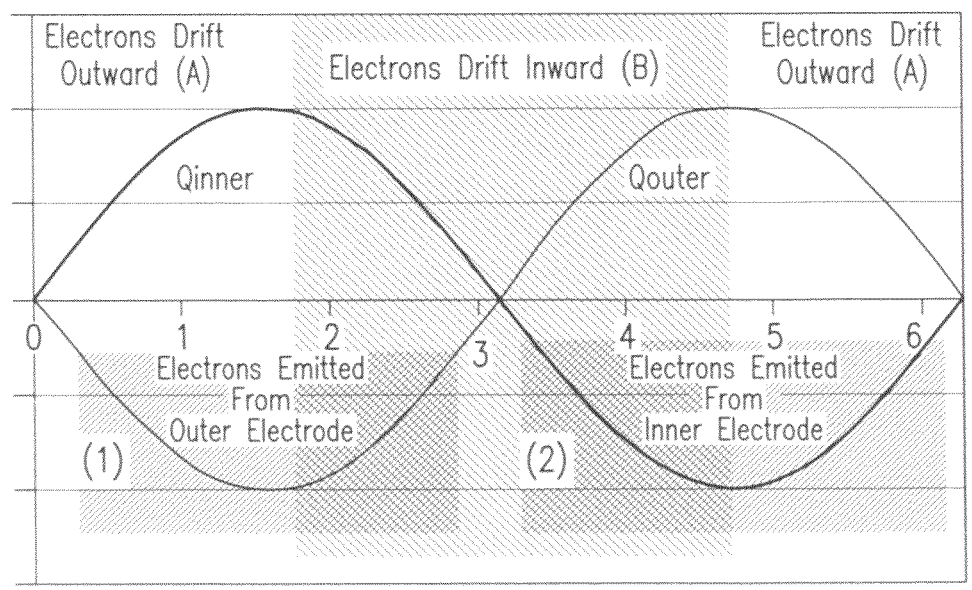
FIG. 13 is a diagram showing the variation in charge state of the inner ($Q_{inner}$) and outer ($Q_{outer}$) conductors over a full cycle indicating the notional regions (regions 1, 2) where significant electron release would typically occur as a result of the electrical field at the conductor surface.

Separating variables and integrating produces $$\frac{r_2}{r_1} = \left[1 + \frac{2m_e(q_2 - q_1)}{eB_z^2 C \ln(b/a) r_1^2}\right]^{1/2} \quad \text{(Eq. 37)}$$

giving the ratio of initial to final radial position of the electron over a change in the inner conductor charge state. FIG. 13 shows the variation in charge state of the inner ($Q_{inner}$) and outer ($Q_{outer}$) conductors over a full cycle, indicating the notional regions (regions 1, 2) where significant electron release would typically occur as a result of the electric field at the conductor surface. Note that the electron emission from the inner electrode 52 will have a lower threshold due to a smaller radius of curvature and higher electric field. Also indicated by shading are the regions where free electrons will drift outward (region A) or inward (region B) across the magnetic field lines due to the polarization drift.

While dielectric breakdown would normally initiate as the charge magnitude on the inner conductor passes a critical negative value (region 2), the polarization drift forces these electrons back toward the inner electrode surface (region B).

It is not until the charge reaches its peak and the polarization drift changes direction (region A—right) that the charges may start to migrate outward. Migration continues until the polarization drift again changes direction (region B) and the charges begin to migrate back toward the inner electrode. By the time the outer electrode 52 reaches its peak negative value, these charges have been returned to the inner electrode 50 where they started, and the cycle repeats. The same process occurs for electrons emitted from the outer electrode over the other half of the cycle.

The capacitor size and magnetic field strength are to be chosen to ensure that the electrons are turned around prior to reaching the opposite electrode. The full change in charge state of the capacitor 36, 38 over the time it takes for the electrons to cross the gap is $2q_{max}=2I_{max}/\omega$. The limiting ratio of electrode radii is then found using Eq. 37

$$\frac{b}{a} > \left[1 + \frac{4m_e I_{max}}{e\omega B_z^2 C \ln(b/a) a^2}\right]^{1/2} \approx \frac{N}{113 B_z a_{cm}} \left(\frac{R I_{max} \overline{f}}{\ln(b/a)}\right)^{1/2} \quad \text{(Eq. 38)}$$

where $a_{cm}$ is the inner cylinder 50 radius in centimeters, and the other terms are as previously defined. To find the capacitor length, a set of concentric cylinders is assumed with an impedance matched to that of the coil 12, 16 at resonance.

This assumes the capacitance of the coil 12, 16 is negligible, but it could be included in the calculation at this point. Ignoring the coil capacitance results in $$C = \frac{2\pi l \varepsilon_0}{\ln(b/a)} = \frac{1}{\omega^2 L} \Rightarrow l_{cm} \quad \text{(Eq. 39)}$$
$$= 100 \frac{\ln(b/a)}{2\pi \varepsilon_0 \omega^2 L} \approx 91 \frac{\ln(b/a)}{\overline{f}^2 N^2 R}$$

where $l_{cm}$ is the capacitor length in centimeters. Substituting Eq. 38 into Eq. 39 then implies $$\pi b_{cm}^2 l_{cm} \approx \frac{I_{max}}{45 \overline{f} B_z^2} \text{ cm}^3 \quad \text{(Eq. 40)}$$

showing that the volume of the cylindrical capacitor is driven by the choice of maximum current, frequency and magnetic field. The most compact geometry is when $l_{cm} \approx 2b_{cm}$, and the capacitor 36, 38 fits within a cube. For the baseline case and assuming an applied magnetic flux density of 0.3 Tesla, the volume given by Eq. 40 is 216 cm³. This results in a capacitor length of 12 cm, an outer electrode radius of 6.0 cm and an inner electrode radius of 4.6 cm.

Returning to FIG. 2, in order to boost the range of power transfer, passive repeaters 70 are envisioned in the subject system 10.

The passive repeaters 70 are the intermediate coils which resonate in phase with the primary oscillator 12, to receive the power therefrom, and in phase with the secondary resonator 16 to further transfer power to the secondary oscillator 16.

Attenuation and Environmental Coupling

There are a variety of ways in which the transmitting 12 and receiving 16 coils can interact with the environment, potentially resulting in a shift in the frequency, attenuation of the delivered power or reduction of overall efficiency. The degree to which each of these would occur is highly specific to the properties and distribution of materials within the reach of the magnetic field. A general overview of the effects and their insertion into the current formalism may be discussed.

The frequency shift results from a change of the effective inductance of either of the coils, resulting from the presence of a material with magnetic permeability above unity, similar to placing an iron core within a solenoid. The larger the volume of material present, and the closer it is to the coil, the greater the shift in frequency that will result. The effect of the presence of the material on the inductance can be estimated as follows. The reactive power within the coil is given by $P_R = L\omega I_{max}^2$, which can also be written as $$P_R = 2\omega \left(\frac{1}{2} L I_{max}^2\right) = 2\omega \int_{vol} \frac{1}{2\mu_0} B_{max}^2 dV \quad \text{(Eq. 41)}$$

In a region with a material that has a permeability greater than unity, the ratio of $B_{max}$ with the material present to that without the material present is $(1+\chi)$, where $\chi$ is the susceptibility. If the magnetic field is uniform within this region, the increase in the effective inductance, normalized by the original value is then $$\frac{\Delta L}{L} = \frac{\chi B_{max}^2 \Delta V}{L I_{max}^2} \quad \text{(Eq. 42)}$$

where $B_{max}$ is evaluated locally, and $\Delta v$ is the volume occupied by the material. A term such as this can be included for each region where magnetic material is present. From Eq. 9, the term $I_{max}^2$ will divide out and only geometric dependencies will remain. The amount of frequency shift that results is found simply by taking the differential of expression for the resonant frequency of the coil $$2\frac{\Delta f}{f} = -\frac{\Delta L}{L} - \frac{\Delta C}{C} \quad \text{(Eq. 43)}$$

where it can be seen that a positive increase in the inductance will result in a drop in the natural frequency of the coil. Because the effect on each coil will be different, depending on it location in the environment, the simplest solution is to compensate for this shift at each coil independently by adjusting the capacitance until the proper resonant frequency is achieved.

For any given placement of the coils in a static environment, this may be done initially and should not need to be altered. However, it would be straightforward to track the frequency and dynamically update it to compensate for changes in the environment or for the motion of either of the coils through the environment. This effect is therefore not thought to be problematic from an operational standpoint.

Likewise, attenuation of the signal by the environment is of little concern. Unlike electromagnetic radiation, which can be very effectively attenuated by the presence of conductors, the magnetic field is much more difficult to shield. A particular application resulting from this phenomenon is the ability to penetrate the depths of the ocean, either for the delivery of power, desirable for recharging Autonomous Underwater Vehicles (AUVs), or for transferring information by modulating the signal. When magnetic field attenuation is desired, it is typically necessary to completely enshroud the item to be shielded in a high permeability material. The attenuation results from the 'conduction' of the field lines around, rather than through the device that is to be shielded. The amount of attenuation, given as the ratio of un-attenuated to attenuated field strength is approximately $$A \approx \frac{\mu}{2}\frac{\Delta}{R} \quad \text{(Eq. 44)}$$

where μ is the permeability of the shielding, Δ is the thickness of the shielding and R is the characteristic size of the shielded region. Effective attenuation without excessive mass therefore requires a high permeability material, and the smallest possible enclosure volume. In most cases of interest, it is unlikely that a situation will naturally exist to produce appreciable levels of signal attenuation.

Of greater concern is the possibility of power lost to the environment, resulting in a reduction of overall efficiency. Sources of such power loss include dipole oscillations in paramagnetic and diamagnetic materials, the dissipation associated with eddy currents induced in conducting materials and the hysteretic loss resulting from domain reconfiguration in ferromagnetic materials. The first of these is treated in a similar manner to the dielectric losses of Eq. 31. In fact, under the proper definition of the loss tangent, the effect would be introduced into the formalism in an identical manner. However, the evaluation of this effective loss tangent will depend on the total volume and distribution of this material within the dipole field, just as with the effect on induction. If at the location of the material the magnetic field is again assumed to be spatially constant, the reactive power per unit volume at this location is given by $$\frac{P_R}{\Delta V} = \varepsilon = \frac{d}{dt}\left(\frac{1}{2\mu_0}B^2\right) = \frac{BB}{\mu_0} = \frac{\omega B_{max}^2}{\omega_0} \quad \text{(Eq. 45)}$$

which could also be found by performing the integration of Eq. 41 over only the volume of magnetic material. Inserting Eq. 9 for the magnetic dipole field at the location of the material, and dividing by $I_{max}^2$ gives the effective reactance of the material (per unit volume) referenced to the recirculating coil current. This is then multiplied by the volume of material under consideration and inserted into Eq. 31 in place of the product Lω, along with the appropriately defined loss tangent of the material for magnetic dipole oscillations.

A similar situation exists for ferromagnetic materials, however the dissipation resulting from domain hysteresis is given per unit volume as $$\frac{P_{hys}}{\Delta V} \approx 2fH_C B_{rem} \quad \text{(Eq. 46)}$$

where $H_C$ is the coercivity of the material (where B=0) and $B_{rem}$ is the remnant magnetization (where H=0). The product $H_C B_{rem}$ is referred to as the energy product and represents an approximation to the area under the hysteresis loop, provided that the material is being fully saturated. Unless the material is very close to one of the coils, it is unlikely that this will be the case. An approximation for the case when saturation has not been reached can be made with $$\frac{P_{hys}}{\Delta V} \approx 2fH_C B_{rem}\left(\frac{H(I_{max})}{H_C}\right)^2 \quad \text{(Eq. 47)}$$

where a linear scaling with magnetic field strength has been assumed along the magnetic flux density axis of the hysteresis diagram, as well as along the magnetic field strength axis. This is now a function of $I_{max}^2$ as before, and the expression $P_{hys}/I_{max}^2$ is then substituted into Eq. 7 as a resistance term.

Finally, we consider the case of induced eddy currents in conductors that may be present. From a straightforward application of Faraday's Law, the power dissipated per unit volume from currents induced in a conductor with finite resistance scales approximately as $$\frac{P_{eddy}}{\Delta V} \approx \sigma(fB_{max}d)^2 \quad \text{(Eq. 48)}$$

where σ is the conductivity of the material, and d is the characteristic size of the region perpendicular to the local magnetic field direction. Because the loss per unit volume is seen to scale with the size of the region, it is important to distinguish between a single continuous region of conducting material versus a region of comparable size where multiple unconnected sub-domains of conducting material may exist. As above, this loss can be converted into a resistance, referenced to the recirculating current in the coil, and inserted into the formalism via Eq. 7.

For all of the cases except for the attenuation (shift in frequency, or the various dissipation mechanisms) the dependence of the effect in question on the local magnetic field strength is quadratic. For a constant volume of a given magnetic material, Eq. 9 shows that the impact this material will have on the system performance scales with distance to the center of the coil as $D^{-6}$, and the impact of these effects rapidly diminishes with distance.

For instance, if a volume of iron placed one meter from the coil was able to shift the frequency by 10%, at two meters the effect would be reduced to only 0.16%. Proper placement of the coil within the environment can therefore significantly reduce the effects that have been discussed. Alternatively, the coupling between the coils has the same $D^{-6}$ scaling. So, as a fraction of the power coupled, the effect of these materials is scale invariant. In other words, a material placed halfway between two coils that dissipated 10% of the total coupled power, would still dissipate 10% of the total coupled power if the separation distance between the coils was increased by a factor of ten. Under this increase in distance, both of these power values would be decreased by $10^{-6}$.

Development of the low-loss antenna circuit is presented herein to allow for inductive power coupling at high efficiency over long distances (over 100 meters). To achieve low loss, superconducting materials are used for all current carrying elements, dielectrics are avoided and the system is operated at low frequencies (below 200 KHz), and at wavelengths that exceed the antenna diameter by several orders of magnitude. Maximum power coupling and maximum efficiency cannot be achieved simultaneously, however efficiencies as high as 50% have been achieved with the present system at maximum power coupling.

Further reduction in the radiative losses may be achieved by adding an external capacitance in which no dielectric is used. To address this, electrical breakdown of a cylindrical capacitor is suppressed by the application of a magnetic cross-field that acts to impede the motion of electrons across the air gap. The resulting capacitor size is very reasonable in comparison to the baseline size of the coil. The interaction of the system with the environment is quite weak, however mechanisms for power dissipation, attenuation and modification of the natural frequency are identified and examined parametrically.

Although this invention has been described in connection with specific forms and embodiments thereof, it will be appreciated that various modifications other than those discussed above may be resorted to without departing from the spirit or scope of the invention as defined in the appended claims. For example, functionally equivalent elements may be substituted for those specifically shown and described, certain features may be used independently of other features, and in certain cases, particular locations of elements, steps, or processes may be reversed or interposed, all without departing from the spirit or scope of the invention as defined in the appended claims.

What is being claimed is:

1. A system for long range wireless energy transfer, comprising:
   a first oscillator structure coupled to a power source and at least one second oscillator structure displaced from said first oscillator structure a distance D to receive energy therefrom, and
   a plurality of capacitor elements, each coupled to a respective one of said first and said at least one second oscillator structures, said each capacitor element including an inner cylindrical electrode and at least one outer cylindrical electrode disposed in a co-axial surrounding relationship with said inner cylindrical electrode, wherein at least one air gap is defined between cylindrical walls of said inner and at least one outer cylindrical electrodes;
   wherein said first and at least one second oscillator structures are configured into compact coils, said first and said at least one second oscillator structures being formed from a superconducting material composition and resonating substantially at the same frequency maintained below a predetermined frequency level sufficient for providing energy coupling between said first and said at least one second oscillator structures.

2. The system of claim 1, wherein each of said compact coils of said first and at least one second oscillator structure is a flat coil having a plurality of windings positioned in the same plane.

3. The system of claim 2, further comprising a dielectric material with a negligible dissipation factor disposed between said windings in said flat coils of said first and said at least one second oscillator structures.

4. The system of claim 1, wherein said predetermined frequency level is below approximately 1 MHz.

5. The system of claim 1, wherein said predetermined distance D falls in the range covering mid-range of approximately tens of meters and long-range exceeding 100 meters.

6. The system of claim 1, wherein said power source is coupled up-stream of said first oscillating structure, said system further including at least one power consuming unit coupled down-stream of said at least one second oscillating unit, a drive coil coupled between said power source and said first oscillator structure, and a drain coil coupled between said at least one second oscillator structure and said at least one power consuming unit.

7. The system of claim 1, wherein diameters of said compact coils of said first and said at least one second oscillator structures fall in the range between 10 cm and several meters.

8. The system of claim 1, wherein said each capacitor element is formed from a superconducting material.

9. The system of claim 8, wherein the superconducting material for said first and at least one oscillator structures and said each capacitor element is selected from the group consisting of Type I superconductors, High Temperature Superconductors, including BSCCO, and YBCO, and room temperature superconductors.

10. The system of claim 8, further comprising a thermo-control system including a plurality of cryogenical units, each operatively engaged with a respective one of said first and at least one second oscillator structures, and said each capacitor element, to maintain said superconducting material thereof at a predetermined temperature level.

11. The system of claim 1, wherein each of said first and at least one second oscillator elements, and said each capacitor element is a dielectric-less component.

12. The system of claim 11, further comprising a magnetic field applied axially to said each capacitor element to increase a breakdown voltage threshold in said at least one air gap, thereby increasing the dielectric strength of air in said at least one air gap of said each dielectric-less capacitor element.

13. The system of claim 1, wherein said at least one air gap is filled with a dielectric material having a low dissipation factor.

14. The system of claim 1, further comprising at least one booster resonator coil positioned between said first and said at least one second oscillator structures, said at least one booster resonator coil resonating in phase with said first oscillator structure to receive energy therefrom, and in phase with said at least one second oscillator structure to transfer energy thereto.

15. The system of claim 1, wherein the length of said each capacitor element lcm≈2 bcm, wherein lcm is the length of said capacitor element, and bcm is the radius of said at least one outer cylindrical electrode in cm.

16. The system of claim 15, wherein the volume of said each capacitor element is $$\pi \cdot b_{cm}^2 \cdot l_{cm} \approx \frac{I_{max}}{45 \bar{f} \cdot B_z} \text{ cm}^3,$$

where Imax is the maximum current of said capacitor element,
$\bar{f}$ is the resonant frequency, and
$B_z$, is the strength of the axial magnetic field applied to the capacitor element.

* * * * *